United States Patent [19]

Mallon

[11] Patent Number: 5,362,353
[45] Date of Patent: Nov. 8, 1994

[54] FARADAY CAGE FOR BARREL-STYLE PLASMA ETCHERS

[75] Inventor: Thomas G. Mallon, Santa Clara, Calif.

[73] Assignee: LSI Logic Corporation, Milpitas, Calif.

[21] Appl. No.: 23,305

[22] Filed: Feb. 26, 1993

[51] Int. Cl.$^5$ .............................................. C23F 1/02
[52] U.S. Cl. .................. 156/345; 118/722; 118/723 FI
[58] Field of Search .................. 43/56; 156/345; 118/722, 723

[56] References Cited

U.S. PATENT DOCUMENTS

| | | | |
|---|---|---|---|
| 3,066,044 | 11/1962 | Samuel | 118/722 |
| 4,203,387 | 5/1980 | McMullen | 118/722 |
| 4,303,467 | 12/1981 | Scornavacca | 156/345 |
| 4,631,105 | 12/1986 | Carroll | 156/345 |
| 4,989,540 | 2/1991 | Fuse | 156/345 |
| 5,099,100 | 3/1992 | Bersin | 156/345 |
| 5,217,560 | 6/1993 | Kurono | 156/345 |
| 5,236,548 | 8/1993 | Stadler | 156/345 |

FOREIGN PATENT DOCUMENTS

| | | |
|---|---|---|
| 0195730 | 6/1989 | Japan . |
| 0195731 | 6/1989 | Japan . |
| 0417330 | 1/1992 | Japan . |
| 0444225 | 2/1992 | Japan . |

OTHER PUBLICATIONS

C. J. Mogab, VLSI Technology (McGraw-Hill Book Co. 1988), pp. 303–309.
Brian Chapman, Glow Discharge Processes (John Wiley & Sons 1980), pp. 322–323.
Sorab K. Ghandhi, VLSI Fabrication Principles (John Wiley & Sons 1983), pp. 499–501.

Primary Examiner—Robert Kunemund
Assistant Examiner—Joni Y. Chang
Attorney, Agent, or Firm—Poms, Smith, Lande & Rose

[57] ABSTRACT

An improved Faraday Cage is provided for use in reducing ion damage to semiconductor wafers during plasma etching. The improved Faraday Cage consists of a cylindrical metallic chamber having a cap at one or more ends. Semiconductor wafers are placed within the Cage and the Cage is suitably disposed within a plasma etcher. The caps substantially reduce the amount of harmful radiation which can enter the Cage and thereby ion damage to the wafers contained therein. The improved Faraday Cage can be conveniently integrated with a barrel-style plasma etcher by securing one of the Cage caps to the door of the plasma etcher such that opening and closing the door serves to disengage and engage one of the caps from the Cage.

16 Claims, 1 Drawing Sheet

FARADAY CAGE FOR BARREL-STYLE PLASMA ETCHERS

BACKGROUND OF THE INVENTION

1. Field of the Invention

The present invention relates to a Faraday Cage for use in conjunction with plasma etching of semiconductor wafers. More particularly, the present invention relates to an improved Faraday Cage for use with a barrel-style plasma etcher in order to provide enhanced radiation protection for semiconductor wafers during the plasma etching process.

2. Description of Related Art

A Faraday Cage is a cylindrical device of perforated metal designed for use in conjunction with a plasma etcher. The Cage serves to inhibit radiation damage to semiconductor wafers during plasma etching. Although the following discussion is directed to silicon wafers, it should be understood that the concepts discussed apply to the etching of any semiconductor material. FIG. 1 shows a side view of a typical prior art Faraday Cage 8 containing a number of silicon wafers 10. The wafers 10 are placed end-to-end in the Cage 8 generally perpendicular to its longitudinal axis, and supported within the Cage 8 by one or more racks 4 as shown in FIG. 2. Each silicon wafer 10 contains a gridwork of dies 6. The plasma chemically reacts with and thereby etches certain portions of the dies in accordance with a photoresist pattern applied and selectively activated in prior manufacturing steps. After further etching and processing steps the wafer gridwork is separated into individual dies to form integrated circuits.

In a typical barrel-style plasma etching process, the prior art Faraday Cage 8 containing wafers 10 is placed within a quartz reactor vessel which generates and confines the plasma. The oblong metal periphery of the Faraday Cage reduces the flux of harmful ions entering the Cage while desirable uncharged radicals and other neutral molecules are free to enter through perforations 7. The radicals and other molecules which pass through the Cage perforations chemically react with the wafers in accordance with the predetermined pattern of the selectively activated photoresist. The prior art Cage serves to reduce the quantity of ions which can reach the wafers by grounding and thereby neutralizing the charged ions which strike its metallic outer surface. Further details on the use of prior art Faraday Cages in conjunction with plasma etching may be found in VLSI Fabrication Principles by Sorab K. Ghandi.

An important problem with the prior art Faraday Cage described above is its inability to adequately restrict undesirable ion penetration. As shown in FIGS. 1 and 2, a typical prior art Faraday Cage is open at each end 2, 3 of the Cage 8. Substantial amounts of charged ion radiation can penetrate the open ends 2, 3 and damage the wafers 10 contained therein. The unrestricted entry of harmful ions at either end of the cage results in higher etch rates for the wafers that are at or near the ends of the Cage and significantly increased ion damage for all wafers within the cage. Uneven etching rates and other ion induced damage result in a significant number of defective dies, and thereby increase labor, material and production costs and reduce integrated circuit manufacturing efficiency.

As is apparent from the above, there presently is a need for an improved Faraday Cage which can substantially reduce the ion damage resulting from plasma etching and thereby enhance the efficiency of the integrated circuit manufacturing process. The improved Faraday Cage should permit uniform etch rates and a higher yield of acceptable dies from a given plasma etched wafer, thereby reducing material and production costs. Furthermore, the improved Faraday Cage should be readily adaptable for convenient placement within a typical barrel-style plasma etcher. The improved Faraday Cage should provide these advantages while maintaining the accessibility and simple construction associated with the prior art Faraday Cages.

SUMMARY OF THE INVENTION

The present invention provides an improved Faraday Cage for use in plasma etching of semiconductor wafers. The improved Faraday Cage is compatible with a variety of different plasma etching techniques, but is particularly well-suited for use in a barrel-style plasma etcher. One preferred embodiment of the Faraday Cage of the present invention comprises a metallic chamber adapted for being disposed within the quartz reactor vessel of a barrel-style plasma etcher and for permitting access of at least one semiconductor wafer. The quartz reactor vessel is contained within the plasma etcher housing, and is adapted to receive a gas capable of being excited into a plasma for etching semiconductor wafers. The metallic chamber has openings at each end thereof and a surface with a plurality of perforations therein at predetermined distances from one another. The improved Faraday Cage further comprises at least one cap suitable for substantially covering one of the ends of the metallic chamber, with the end of the chamber adapted to receive the cap.

In accordance with another aspect of the present invention, one end of the metallic chamber is adapted to receive a cap which is disposed on an interior surface of a door. The door is pivotally attached to an anterior end of the plasma etcher housing such that when the door is pivotally moved towards the metallic chamber, the cap engages an end of the metallic chamber. Opening the door of the plasma etcher thus serves to disengage the cap from the end of the metallic chamber, while closing the door serves to align the cap so as to substantially cover the end of the metallic chamber.

As a feature of the present invention, the improved Faraday Cage results in substantial reductions in the amount of harmful ion radiation reaching the wafers contained therein during the course of plasma etching. The reduced ion penetration also leads to uniform etching rates for all wafers regardless of their position within the Cage. Reduced ion damage and uniform etching rates results in a higher yield of acceptable dies and therefore lower material and production costs and improved efficiency for the overall semiconductor integrated circuit manufacturing process.

As an additional feature of the present invention, the improved Faraday Cage can be conveniently placed within a standard barrel-style plasma etcher and retains the advantages of accessibility and simple construction of the prior art Cages. Thus, the substantial reduction in undesired ion radiation reaching the wafers is accomplished without significant costs for new materials or equipment. Existing Faraday Cages and plasma etchers can be readily modified to incorporate the improvements of the present invention.

The above-discussed features and attendant advantages of the present invention will become better understood by reference to the following detailed description of the preferred embodiments and the accompanying drawings.

DETAILED DESCRIPTION OF THE PREFERRED EMBODIMENTS

Figure 1:
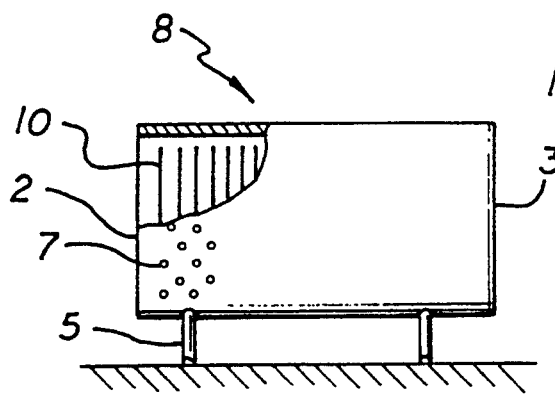
FIG. 1 shows a side view of a typical prior art Faraday Cage.
Figure 2:
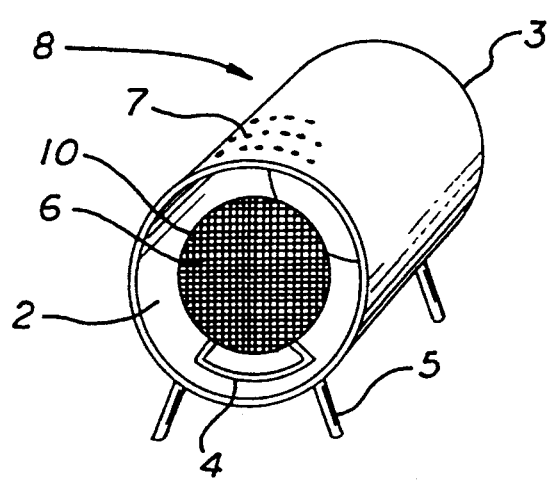
FIG. 2 shows a perspective view of the typical prior art Faraday Cage of FIG. 1.
Figure 3:
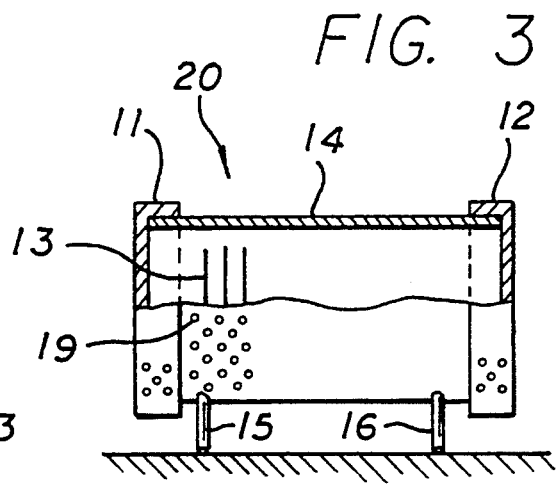
FIG. 3 shows a cross-sectional view of one embodiment of the improved Faraday Cage of the present invention.

The present invention is based upon the discovery that capping the open ends of a typical prior art Faraday Cage provides a simple and effective means of reducing ion radiation damage to the semiconductor wafers contained therein. Although the discussion below is directed to plasma etching of semiconductor materials such as silicon wafers, this is by way of example only. The present invention is also applicable to plasma etching of other types of materials or devices, such as circuit boards. An exemplary preferred embodiment of the present invention is shown in FIG. 3. The improved Faraday Cage is generally denoted by reference number 20. The Faraday Cage 20 consists of a cylindrical metallic chamber 14, legs 15 and 16, and end caps 11 and 12. The metallic chamber 14 is typically constructed of aluminum, but other metals can also be used. The chamber 14 is typically cylindrical in shape but the shape could be varied to meet the needs of a particular application. The cylindrical shape is particularly well suited for plasma etching of semiconductor wafers in that the plasma etchers usually contain a cylindrical quartz reaction vessel in which the Cage is placed, and the semiconductor wafers which are placed within the Cage are usually circular as well. In the embodiment shown, the metallic chamber 14 can be conveniently formed using a single sheet of aluminum of about one-eighth of an inch thickness folded around on itself and riveted or other wise secured together. The thickness of the metallic chamber can vary depending upon the application and the material used. Legs 15, 16 are attached to and support chamber 14 in conjunction with a matching set of legs 17, 18 (not shown) attached to the other side of elongated barrel 14. Alternatively, other types of support mechanisms could be employed. The support mechanism should be capable of placing the cage substantially in the center of the plasma etching vessel such that the entire outer surface of the metallic chamber will be uniformly exposed to the plasma generated within the quartz reaction vessel.

The additional radiation protection of the present invention is accomplished through the use of metallic end caps 11, 12 which fully surround and enclose the two end portions of the chamber 14. Alternatively, end caps 11, 12 could be replaced by end caps which do not surround the end portion of metallic chamber 14 but instead only contact and seal off the periphery of each end portion. In either case, the caps should be formed of aluminum or other metallic material suitable for reducing or eliminating ion penetration. In addition, although the end caps in the present embodiment completely cover the ends of chamber 14, ion penetration can also be reduced by caps which only partially cover the ends of the chamber. Furthermore, the Cage need not include two end caps. For example, a single end cap could provide some reduction in ion penetration, particularly if the wafers are suitably placed within the Cage away from the open end. In cases where the chamber 14 has an alternative shape which may include more than two ends, the number and shape of the caps should be modified accordingly. In the embodiment shown in FIG. 3, end caps 11, 12 have an inner diameter which is just slightly larger than the outer diameter of the metallic chamber 14, and therefore fit snugly on their respective chamber ends. In operation, one or both of the end caps 11, 12 are removed from chamber 14 and wafers 13 are placed on rack 26 which is then suitably disposed within the interior portion of chamber 14. End caps 11, 12 are then refitted onto their respective end portions of chamber 14 and the improved Faraday cage is ready for use with a suitable plasma etching system.

Both the metallic chamber 14 and end caps 11, 12 include a plurality of perforations 19. As was discussed in the background section above, these perforations permit uncharged molecules and radicals to enter the cage as required for effective plasma etching of wafers 13, while harmful charged ions are become grounded and neutralized through contact with the metallic material. Although the end caps 11, 12 are shown with perforations in FIG. 3, it should be understood that this is by way of example only. In certain cases the particular end caps used may not be suitable for perforations. One such case may be one in which the end caps do not overlap the outer surface of the metallic chamber 14. In general, the perforations are circular with diameters of about one-eighth to three-eighths of an inch and arranged such that their centers are spaced about one-eighth to one-half of an inch apart. The exact size and spacing of the perforations will vary depending upon the material used for the metallic chamber and end caps, as well as the type of plasma etching process used. In the embodiment of FIG. 3, circular perforations with a diameter of about one-fourth of an inch are formed in the one-eighth inch thick aluminum chamber 14 and end caps 11, 12 with the centers of the perforations spaced about three-eighths of an inch apart. The perforations are preferably arranged in the honeycomb pattern shown in FIG. 3, although other suitable perforation patterns could also be used.

Figure 4:
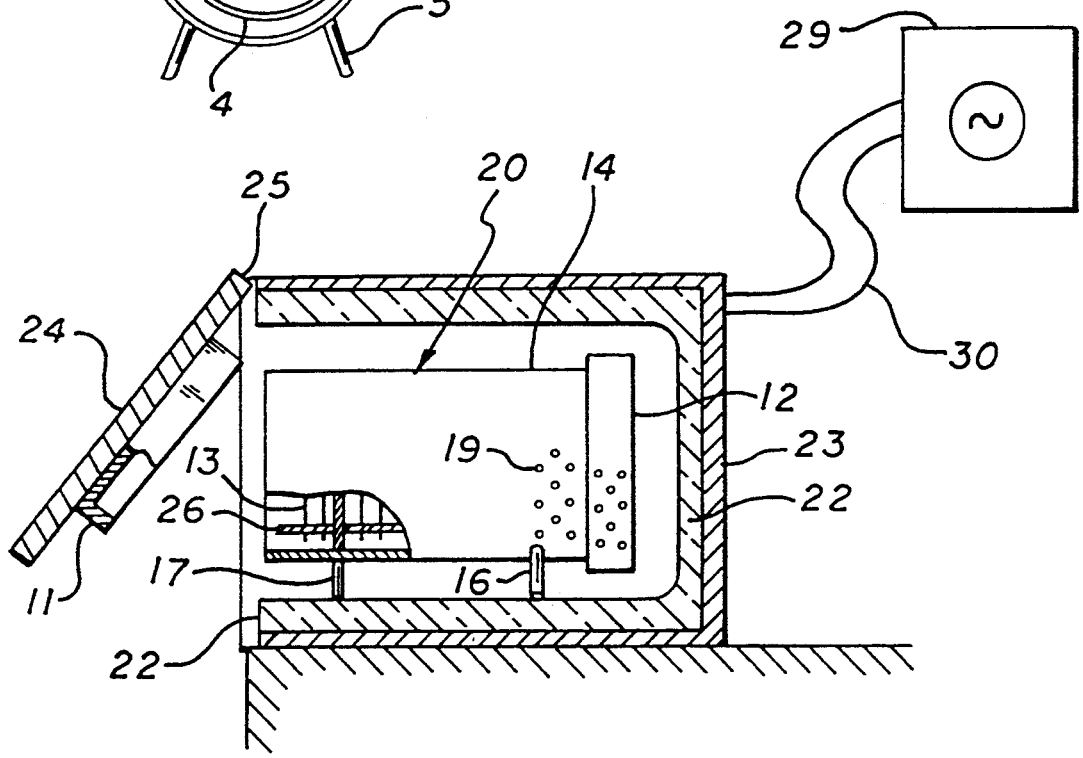
FIG. 4 shows a cross-sectional view of an alternative embodiment of the Faraday Cage of the present invention installed within an exemplary barrel-style plasma etcher.

An alternative embodiment of the present invention is illustrated in FIG. 4. In this embodiment, the improved Faraday Cage is shown arranged within an exemplary barrel-style plasma etcher. It should be understood that the particular plasma etcher shown is exemplary only and that the improved Faraday Cage of the present invention may also be used with a variety of other types of plasma etchers. The barrel-style plasma etcher shown consists of a metal housing 23, a door 24 and a quartz reaction vessel 22 disposed within the metal housing. The door is pivotally attached to the anterior end of the metal housing 23 via a hinge 25. End cap 11 of the Faraday Cage 20 is attached to and centrally disposed on the interior surface of door 24 so as to permit the end cap 11 to mate with one end of metallic chamber 14 when the door 24 is closed. Thus, the cap 11 is either removed from or secured to metallic chamber 14 depending upon the open or closed position of door 24. The arrangement shown thus permits easy access to and closure of the improved Faraday Cage 20 by operation of the door 24. Insertion and withdrawal of the silicon wafers disposed on rack 26 is thereby considerably simplified. End cap 12 could be permanently secured to metallic chamber 14 in this embodiment. Other plasma etchers could be accommodated by suitable modification of the relation of the cap or caps with the door or other opening mechanism.

The operation of the exemplary barrel-style plasma etcher and improved Faraday Cage of FIG. 4 is as follows. The quartz reactor vessel 22 is filled with a gas such as oxygen. Closing the door 24 should seal the quartz reactor vessel 22 to confine the plasma during etching. An O-ring or any other suitable sealing means could be used for this purpose. A frequency generator 29 is coupled to the metal housing 23 and to a grid (not shown) surrounding the quartz reactor vessel 22 via a coaxial cable 30. The frequency generator 29 emits a suitable frequency capable of exciting the gas within the reactor vessel into a plasma. After the quartz jar is sealed, the system is pumped to a low pressure typically about 1 torr, oxygen is injected and the frequency generator transmits a signal of desired frequency to the grid surrounding the quartz vessel 22, exciting the oxygen molecules trapped within the vessel and thereby creating a plasma. The plasma consists of oxygen molecules, as well as ions, electrons and free radicals produced as a result of collisions of excited oxygen molecules. Etching is accomplished when the neutral free radicals and molecules within the plasma chemically react with the portions of wafers 13 selectively exposed in accordance with the photoresist pattern. As was described above, the improved Faraday Cage of the present invention permits desired free radicals and molecules through the perforations in the Cage while undesired ions are inhibited. The end caps 11, 12 prevent ion penetration through either end of the Cage, and thereby greatly reduce ion-induced wafer damage and improve etching uniformity.

It will be appreciated that many other alternate embodiments of the present invention may be utilized without departing from the scope of the invention, which is limited only by the scope of the appended claims.

What is claimed is:

1. An improved Faraday Cage for use in plasma etching of semiconductor wafers in a barrel-style plasma etcher, said plasma etcher having a metal housing and a quartz reactor vessel disposed within said metal housing, said quartz reactor vessel being adapted to receive a gas capable of being excited into a plasma for etching said semiconductor wafers, said improved Faraday cage comprising:
   a metallic chamber adapted for being disposed within said quartz reactor vessel and adapted for permitting access of at least one of said semiconductor wafers, said chamber having a surface with a plurality of perforations therethrough at a predetermined distance from one another, said chamber further having one or more open ends;
   at least one cap suitable for substantially covering one of said ends of said metallic chamber, said end of said chamber being adapted to receive said cap;
   said metal housing of said plasma etcher further comprising an anterior end having a door pivotally attached thereto, said door having an interior surface upon which said cap is disposed such that when said door is pivotally moved towards said metallic chamber, said cap is brought into alignment with one of said open ends of said metallic chamber.

2. The Faraday Cage of claim 1 wherein said metallic chamber is cylindrical in shape.

3. The Faraday Cage of claim 1 wherein each of said perforations are circular with a diameter in a range between about one-eighth to three-eighths of an inch.

4. The Faraday Cage of claim 1 wherein said perforations are arranged in a honeycomb pattern and spaced in a range between about one-eighth to one-half of an inch apart.

5. The Faraday Cage of claim 1, further comprising another cap for substantially covering another one of said open ends.

6. The Faraday Cage of claim 1 wherein each of said caps have a surface with a plurality of perforations therethrough.

7. An improved Faraday cage for use in a plasma etcher, said improved Faraday cage comprising:
   a metallic chamber having a surface with a plurality of perforations therethrough, said chamber further having one or more open ends;
   at least one cap suitable for substantially covering one of said ends of said metallic chamber, said end of said chamber being adapted to receive said cap;
   wherein said plasma etcher comprises a housing having an anterior end with a door pivotally attached thereto, said door having an interior surface upon which said cap is disposed such that when said door is pivotally moved towards said metallic chamber, said cap is brought into alignment with one of said open ends of said metallic chamber.

8. The Faraday Cage of claim 7 wherein said metallic chamber is cylindrical in shape.

9. The Faraday Cage of claim 7 wherein each of said perforations are circular with a diameter in a range between about one-eighth to three-eighths of an inch.

10. The Faraday Cage of claim 7 wherein said perforations are arranged in a honeycomb pattern and spaced in a range between about one-eighth to one-half of an inch apart.

11. The Faraday Cage of claim 7 further comprising another cap for substantially covering another one of said open ends.

12. The Faraday Cage of claim 7 wherein each of said caps have a surface with a plurality of perforations therethrough.

13. An improved Faraday Cage for use in plasma etching of semiconductor wafers in a barrel-style plasma etcher, said plasma etcher having a metal housing and a quartz reactor vessel disposed within said metal housing, said quartz reactor vessel being adapted to receive a gas capable of being excited into a plasma for etching said semiconductor wafers, said improved Faraday Cage comprising:
   a metallic chamber adapted for being disposed within said quartz reactor vessel and adapted for permitting access of at least one of said semiconductor wafers, said chamber having a surface with a plurality of perforations therethrough at a predetermined distance from one another, said chamber further having one or more open ends;
   at least one cap suitable for substantially covering one of said ends of said metallic chamber, said end of said chamber being adapted to receive said cap, wherein said metal housing of said plasma etcher further comprises an anterior end having a door pivotally attached thereto, said door having an interior surface upon which said cap is disposed such that when said door is pivotally moved towards said metallic chamber, said cap is brought into alignment with one of said ends of said metallic chamber.

14. The Faraday Cage of claim 13 wherein said metallic chamber has a first and second open end, each of said open ends being adapted to receive a cap, and a first and second cap, one of said caps suitable for substantially covering one of said open ends.

15. The Faraday Cage of claim 13 wherein each of said caps have a surface with a plurality of perforations therethrough.

16. The Faraday Cage of claim 14 wherein said first cap is attached to said interior surface of said door and adapted to contact said first end of said metallic chamber and wherein said second cap is adapted to contact said second end.

* * * * *